(12) United States Patent
Tatoh et al.

(10) Patent No.: US 6,506,624 B2
(45) Date of Patent: Jan. 14, 2003

(54) METHOD OF MANUFACTURING AN OPTICAL SEMICONDUCTOR MODULE

(75) Inventors: Nobuyoshi Tatoh, Itami (JP); Shinya Nishina, Itami (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 0 days.

(21) Appl. No.: 09/945,809

(22) Filed: Sep. 5, 2001

(65) Prior Publication Data

US 2002/0028572 A1 Mar. 7, 2002

(30) Foreign Application Priority Data

Sep. 5, 2000 (JP) .......................... 2000-268185

(51) Int. Cl.[7] .............................................. H01L 21/50
(52) U.S. Cl. ...................... 438/106; 257/778; 257/779; 257/780; 438/107; 438/108
(58) Field of Search ................................ 438/612, 106, 438/107; 257/737, 778, 779, 780

(56) References Cited

U.S. PATENT DOCUMENTS 6,190,940 B1 * 2/2001 DeFelice et al. ............ 438/106
6,220,765 B1 * 4/2001 Tatoh ........................... 385/94

FOREIGN PATENT DOCUMENTS

| JP | 59-091765 | 6/1984 |
| JP | 05-067844 | 3/1993 |
| JP | 10-098141 | 4/1998 |
| JP | 11-074394 | 3/1999 |

* cited by examiner

*Primary Examiner*—David Nelms
*Assistant Examiner*—Reneé R. Berry
(74) *Attorney, Agent, or Firm*—McDermott, Will & Emery

(57) ABSTRACT

A method of manufacturing an optical semiconductor module, comprising joining an electronic cooling element to a bottom plate of an optical semiconductor package and mounting an optical semiconductor element on the electronic cooling element, wherein the electronic cooling element is soldered to the bottom plate of the optical semiconductor package in a hydrogen atmosphere. The soldering in a hydrogen atmosphere prevents oxidation of a low temperature solder provided on the uppermost surfaces of the electronic cooling element and conduction of the heat at the soldered joint portion between the electronic cooling element and the optical semiconductor element is improved.

3 Claims, 2 Drawing Sheets

METHOD OF MANUFACTURING AN OPTICAL SEMICONDUCTOR MODULE

BACKGROUND OF THE INVENTION

1. Field of the Invention

The present invention relates to a method of manufacturing an optical semiconductor module for optical communication and in particular to a method of manufacturing a high-output optical semiconductor laser module for an optical fiber amplifier where high heat radiating ability is needed.

2. Description of the Related Art

In optical semiconductor devices, in particular in optical semiconductor modules such as optical semiconductor laser modules for optical fiber amplifiers, an optical semiconductor package is employed for hermetically accommodating an optical semiconductor, a driver IC, etc.

For example, as shown in FIG. 4, typically, in an optical semiconductor package, a frame 1 made of Fe/Ni/Co alloy (trade name KOVAR) is joined to a bottom plate 2 of, for example, Fe/Ni/Co alloy or Fe/Ni alloy (trade name 42 Alloy) or a composite metallic material, for example, CuW or CuMo. In particular, in a semiconductor package where power consumption is high, and high heat radiating capability is demanded, a CuW bottom plate is employed.

The frame 1 that constitutes the side walls of the semiconductor package is manufactured by machining or injection molding of KOVAR, and, in part thereof, is provided with ceramic terminals 3 which are constituted by a plurality of layers of ceramic sheet whose surface is metallized; a plurality of terminal leads 4 made of KOVAR are arranged projecting to the outside of the frame 1. Some optical semiconductor packages have a structure in which the side walls of the frame-are constituted of a ceramic insulator so as to be integrated with the ceramic of the terminals. Also, some optical semiconductor packages have a construction in which the terminal leads are glass-sealed into holes provided in the frame.

Also, a light transmitting window 5 for transmission of light between the inside and outside is formed in the frame 1 of the optical semiconductor package. The light transmitting window 5 consists of a pipe made of KOVAR, usually with a glass window member provided thereon to effect hermetic sealing. In some light transmitting windows 5 a glass window member is not employed but an optical fiber is passed therethrough and is hermetically sealed by soldering the optical fiber. In such cases, only the pipe of light transmitting window 5 is bonded to the frame 1 of the optical semiconductor package.

Assembly is effected by joining these components such as frame 1, bottom plate 2 and terminal leads 4, etc., by silver brazing, glass brazing, AuSn soldering or the like. The assembled optical semiconductor package as a whole is subjected to gold plating in order to perform final hermetic sealing with a lid, in order to prevent corrosion of the package, and in order to facilitate soldering in subsequent assembly step of the semiconductor module. A KOVAR ring is required for purposes of welding or soldering the lid on the upper surface of the frame 1 of the optical semiconductor package. Also, the melting point of the silver brazing alloy employed for assembly of the package is 600° C. or more, the melting point of the glass brazing material is 500° C. or more, and the solder for the window is AuSn, which has a melting-point of about 280° C.

In order to package an optical semiconductor element in such an optical semiconductor package, an electronic cooling element is mounted on the bottom plate and then a circuit board on which an optical semiconductor element etc. have already been mounted are fixed thereon. In the electronic cooling element, N-type thermoelectric elements (for example BiTeSe) and P-type thermoelectric elements (for example BiTeSb) are arranged alternately in parallel, with the upper surfaces and lower surfaces of two respective adjacent thermoelectric elements being joined by a Pb60Sn40 solder having a melting point of 238° C. to, the metal piece formed on the ceramic substrates. A Cu lead is connected to the outgoing electrode of the ceramic substrate, using a Pb90Sn10 solder having a melting point of 299° C.

The electronic cooling element and the optical semiconductor package are then connected by means of a lead formed within the package, and the optical semiconductor element and the terminal leads of the optical semiconductor package are electrically connected by means of an Au wire. After sealing the cap onto the ring made of KOVAR, the optical semiconductor module is then manufactured by aligning the optical fiber in position on the light transmitting window of the semiconductor package and welding with for example a YAG laser.

In the electronic cooling element for an optical semiconductor module, metallizing is performed on the non-joined surfaces (the uppermost surface and lowermost surface of the electronic cooling element) of the ceramic substrate which is joined to the respective thermoelectric elements. For the joining between the lowermost surface of this electronic cooling element and the optical semiconductor package, a Pb37Sn63 solder having a melting point of 183° C. is employed, and for the joining between the uppermost surface of the electronic cooling element and the optical semiconductor element, a low temperature solder having a melting point of 160° C. or less, such as BiSn, is typically employed. These solder layers (which may also be referred to as "a pre-solder") are laminated beforehand onto the electronic cooling element.

In an optical semiconductor module, in order to achieve optical coupling of the optical fiber and the optical semiconductor element, the optical semiconductor package and the electronic cooling element must be precisely positioned when soldering is effected. In order to achieve this, first of all the electronic cooling element is located in position by means of a die bonding tool, then heated to 183° C. or more and joined to the bottom plate of the package using a Pb37Sn63 solder; after cooling, the die bonding tool is removed, and the optical semiconductor element is joined onto the top of the electronic cooling element using a low temperature solder such as BiSn.

However, there was the problem that when soldering the electronic cooling element onto the optical semiconductor package, the low temperature solder such as BiSn provided on the opposite surface (uppermost surface) of the electronic cooling element was melted, and oxidized. Consequently, slag was produced on the low-temperature solder such as BiSn, raising the thermal resistance of the solder joint when solder joining of the optical semiconductor element onto the uppermost surface of the electronic cooling element was effected. If the thermal resistance of this soldered joint is high, in the case of laser, the optical output of the optical semiconductor element such as an LD element is lowered, and, in addition, in the case of light-wave guide devices, the thermal uniformity becomes poor, widening the wavelength selectivity, in particular the half-value width, causing crosstalk.

SUMMARY OF THE INVENTION

In view of the above-mentioned prior art, an object of the present invention is to provide a method of manufacturing an optical semiconductor module wherein, when the electronic cooling element is joined to the optical semiconductor package, oxidation of the low temperature solder (pre-solder) provided on the uppermost surfaces of the electronic cooling element is prevented, and conduction of the heat at the soldered joint portion between the electronic cooling element and the optical semiconductor element is improved.

In order to achieve the above object, an object of the present invention is to provide a method of manufacturing an optical semiconductor module, comprising joining an electronic cooling element to a bottom plate of an optical semiconductor package and mounting an optical semiconductor element on the electronic cooling element, wherein the electronic cooling element is soldered to the bottom plate of the optical semiconductor package in a hydrogen atmosphere.

In the above-mentioned method of manufacturing an optical semiconductor module according to the present invention, the electronic cooling element may be provided with a PbSn solder on a ceramic substrate face on the side to be joined to the bottom plate of the optical semiconductor package, and a BiSn solder having a lower melting-point than that of the PbSn solder may be applied beforehand to the other ceramic substrate face on the opposite side where the optical semiconductor element is to be mounted.

With the method of the present invention, since, when the electronic cooling element is joined to the optical semiconductor package, solder joining is effected in a hydrogen atmosphere, even if the low temperature solder (pre-solder) for joining of the optical semiconductor element which is provided on the uppermost surface of the electronic cooling element melts, there is no possibility of its being oxidized. On the contrary, since oxide produced during bonding the low temperature solder to the electronic cooling element is removed, an excellent solder surface can be obtained on the low temperature solder on the uppermost surface of the electronic cooling element.

As a result, when the optical semiconductor element is soldered onto the uppermost surface of this electronic cooling element, no slag inclusion occurs, so the thermal resistance at the solder joint between the electronic cooling element and the optical semiconductor element is lowered, making it possible to improve heat conduction in this region. Consequently, the method of the present invention is suitable in particular for manufacturing a high-output optical semiconductor laser module for an optical fiber amplifier, in which high heat radiating ability is necessary.

DESCRIPTION OF THE PREFERRED EMBODIMENTS

Figure 1:
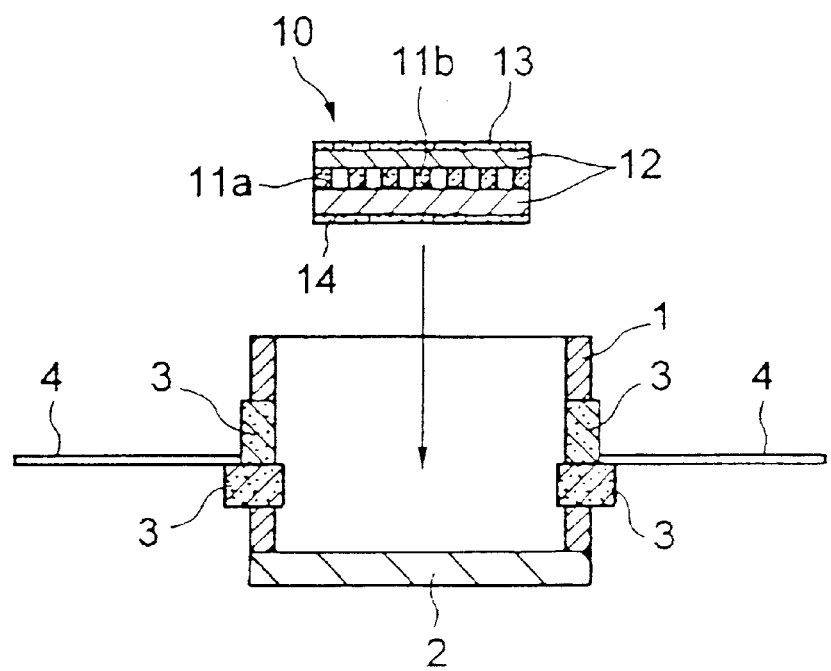
FIG. 1 is a schematic cross-sectional view illustrating an optical semiconductor package and electronic cooling element given in explanation of the method of the present invention.

In the manufacture of an optical semiconductor package, as shown in FIG. 1, a frame 1 constituting the side walls of an optical semiconductor package was produced by machining KOVAR, while a bottom face 2 thereof was made of a composite metallic material CuW. Ceramic terminals 3 were constituted of a plurality of layers of ceramic sheet and their surfaces were metallized. A plurality of terminal leads 4 made of KOVAR were connected to the terminals. Also, a KOVAR pipe was joined to the frame 1 as a light transmitting window 5 of the optical semiconductor package, and a glass window material was joined thereto with AuSn for purposes of hermetic sealing. In addition, a KOVAR ring (not shown) was laminated onto the upper surface of the frame 1. These were joined with a silver brazing alloy at 620° C. or more and subjected to gold plating over the entire surface.

As shown in FIG. 1, an electronic cooling element 10 is constituted by an alternate matrix arrangement of N-type thermoelectric elements (BiTiSe) 11a and P-type thermoelectric elements (BiTeSb) 11b, and the upper surfaces and lower surfaces of two respective adjacent thermoelectric elements 11a and 11b are connected in series by a metallic piece formed on AlN ceramic substrates 12, using a Pb60Sn40 solder having a melting point of 238° C. An Ni/Sn plated Cu lead was connected to outgoing electrodes of ceramic substrates 12 using a Pb90Sn10 solder having a melting point of 299° C. The thickness of Ni in the Ni/Sn plating was 3.5 μm and the thickness of Sn 2 μm.

Metallized layers are formed by printing an AgPd paste onto the surfaces of the respective ceramic substrates 12 which are not joined to thermoelectric elements 11a, 11b of electronic cooling element 10 (i.e. the uppermost face and lowermost face of the electronic cooling element) and then firing the printed layers. A BiSn solder 13 having a melting-point of 140° C. was laminated onto the surface (i.e. the uppermost face) of this electronic cooling element 10 on the side to be joined to an optical semiconductor element and a Pb37Sn63 solder 14 having a melting point of 183° C. was laminated onto the surface (i.e. the lowermost face) on the side to be joined to the bottom plate 2. These are formed by printing the respective solder pastes solder onto the respective ceramic substrates 12 and heating to high temperature to remove organic constituents included in the pastes.

This electronic cooling element 10 was aligned in position using a carbon jig as a die bonding tool, and joined to the bottom plate 2 of the optical semiconductor package with a Pb37Sn63 solder 14 in a hydrogen atmosphere by passing through a continuous hydrogen furnace at 220° C. It was found possible to achieve positional alignment with a precision of 0.1 mm by employing the carbon jig; subsequent optical coupling was thereby made easy. In this joining, joining is facilitated if an Mo spindle with four claws projecting. therefrom is mounted on the electronic cooling element 10 in such a manner that the four claws contact with four corners of the thermoelectric cooling element 10. It is convenient for the purposes of effecting simultaneous joining in the hydrogen furnace if terminal leads 4 are set in position beforehand on the ceramic substrate 3 with solder in the form of a filament entwined around them. By effecting joining using a continuous hydrogen furnace as described above, a throughput of 10 times that achieved hitherto was achieved even with only a single worker.

Figure 2:
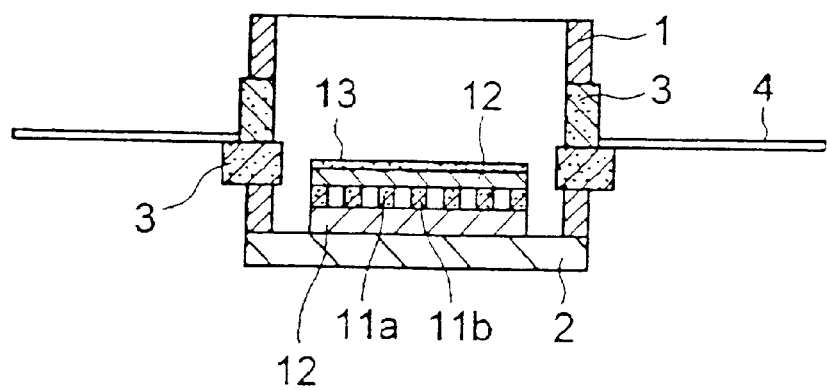
FIG. 2 is a schematic cross-sectional view illustrating an optical semiconductor package in which joining of an electronic cooling element is effected by the method of the present invention.
Figure 3:
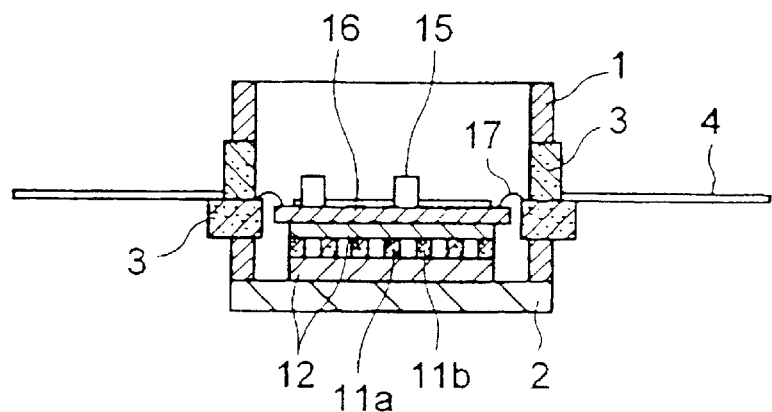
FIG. 3 is a schematic cross-sectional view illustrating the condition in which an optical semiconductor element is mounted on an electronic cooling element within the optical semiconductor package shown in FIG. 2.
Figure 4:
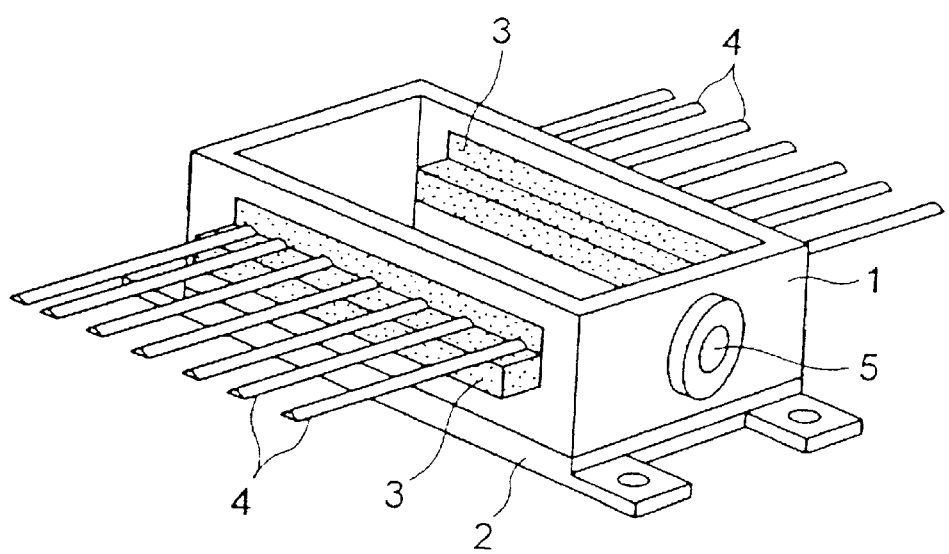
FIG. 4 is a perspective view schematically illustrating a typical optical semiconductor package.

As shown in FIG. 2, in this way, an optical semiconductor package was obtained in which the electronic cooling element 10 was joined to the bottom plate 2. After this, a circuit board 16 on which an optical semiconductor device 15, such as an LD device, was previously mounted was die-bonded in a nitrogen atmosphere as shown in FIG. 3 by means of a BiSn solder 13 that was set in position beforehand on the uppermost surface of this electronic cooling element 10. The necessary wiring was performed using an Au wire 17. Lastly, the optical semiconductor module was completed by sealing with a cap onto the KOVAR ring, then aligning optical fibers in position in the light transmitting window 5 of the optical semiconductor package and welding with a YAG laser.

In the prior art method, since the BiSn solder 13 was melted and oxidized when soldering the electronic cooling element 10 onto the optical semiconductor package, the thermal resistance of the BiSn solder joint was as high as 0.5° C./W, due to the formation of slag. In contrast, in the above embodiment according to the present invention, oxidation of the BiSn solder 13 cannot occur even if it melts, so it proved possible to reduce the thermal resistance of the BiSn solder joint to 0.2° C./W.

With the present invention, when joining an electronic cooling element to an optical semiconductor package, oxidation of a low-temperature solder that is provided beforehand on the electronic cooling device for joining the optical semiconductor element can be prevented, so the thermal resistance at the solder joint in the subsequent joining of the optical semiconductor device is lowered, thereby making it possible to provide a method of manufacturing an optical semiconductor module in which heat conduction 6f the solder joint is improved.

Consequently, in an optical semiconductor module according to the present invention, the thermal resistance between the optical semiconductor element and the electronic cooling element can be reduced to about ⅕ of conventionally, so there is no lowering of the optical output of optical semiconductor elements such as an LD element and thermal uniformity is maintained in the light-waveguide device, so that an excellent wavelength selectivity is achieved. Also, the throughput is multiplied by about 10 times, so a lowering in costs can be anticipated.

What is claimed is:

1. A method of manufacturing an optical semiconductor module, comprising joining an electronic cooling element to a bottom plate of an optical semiconductor package and mounting an optical semiconductor element on the electronic cooling element, wherein the electronic cooling element is soldered to the bottom plate of the optical semiconductor package in a hydrogen atmosphere.

2. The method of manufacturing an optical semiconductor module according to claim 1, wherein said electronic cooling element is provided with a PbSn solder on a ceramic substrate face on a side to be joined to the bottom plate of said optical semiconductor package and a BiSn solder having a lower melting-point than that of said PbSn solder has been applied beforehand onto another ceramic substrate face on an opposite side to be joined to the optical semiconductor element.

3. The method of manufacturing an optical semiconductor module according to claim 1, wherein an optical fiber is joined with a light transmitting window of the optical semiconductor package after mounting the optical semiconductor element on said electronic cooling element.

* * * * *